United States Patent
Andler

[11] Patent Number: 6,143,427
[45] Date of Patent: Nov. 7, 2000

[54] LAMINATED MATERIAL

[75] Inventor: Gerd Andler, Frankfurt am Main, Germany

[73] Assignee: Federal-Mogul World Wide, Inc., Southfield, Mich.

[21] Appl. No.: 08/981,614

[22] PCT Filed: Jul. 10, 1996

[86] PCT No.: PCT/DE96/01272

§ 371 Date: Dec. 23, 1997

§ 102(e) Date: Dec. 23, 1997

[87] PCT Pub. No.: WO97/03219

PCT Pub. Date: Jan. 30, 1997

[30] Foreign Application Priority Data

Jul. 12, 1995 [DE] Germany ............ 195 25 330

[51] Int. Cl.[7] ............. F16C 33/12; C22C 9/08; C23C 14/16
[52] U.S. Cl. ............ 428/645; 428/677; 384/912
[58] Field of Search ............ 428/643, 644, 428/645, 674, 675, 677, 938; 384/912

[56] References Cited

U.S. PATENT DOCUMENTS

| | | |
|---|---|---|
| 4,946,747 | 8/1990 | Bergmann et al. ............ 428/677 |
| 4,961,831 | 10/1990 | Bergmann et al. ............ 204/192.16 |
| 5,004,581 | 4/1991 | Takagi et al. ............ 420/487 |
| 5,045,405 | 9/1991 | Koroschetz et al. ............ 428/674 |
| 5,087,529 | 2/1992 | Engel et al. ............ 428/552 |
| 5,209,578 | 5/1993 | Eastham et al. ............ 384/912 |
| 5,282,908 | 2/1994 | Nakashima et al. ............ 148/434 |
| 5,685,797 | 11/1997 | Barnsby et al. ............ 384/912 |

*Primary Examiner*—John J. Zimmerman
*Attorney, Agent, or Firm*—Reising, Ethington, Barnes, Kisselle, Learman & McCulloch, P.C.

[57] ABSTRACT

A laminated material for a plain bearing includes a running layer characterized by a high degree of hardness and good embedding and adaptation properties and high corrosion resistance. The laminated material is provided with a bearing material applied by sputtering directly to a carrier material, the bearing material comprising a matrix material of copper or copper base alloy with finely divided lead inclusions. The matrix material is isotropically crystallized with polygonal grain shape. The mean crystallite diameter is 2–4 $\mu$m and the grain size of the lead inclusions is 0.2–0.4 that of the crystallite diameter.

18 Claims, 4 Drawing Sheets

30 μm

30 μm

LAMINATED MATERIAL

BACKGROUND OF THE INVENTION

1. Field of the Invention

The invention relates to a multilayer material comprising a bearing material applied directly to a backing material by sputtering, which bearing material comprises a matrix material of copper or a copper-based alloy with finely dispersed lead inclusions.

2. Description of Related Art

Copper-based materials with various alloy elements are widely used as highly-loadable plain bearing materials in modern combustion engines. Their considerable strength makes them suitable for use as connecting-rod bearings, main bearings, piston pin bushings and rocker bushings as well as for use as gear parts or as components in machine construction in general. As the lead content increases and the tin content decreases, for example, conformability to and compatibility with the counter-member increases, whereas corrosion resistance and strength decrease markedly. For use as connecting-rod or main bearings in modern engine construction, these bearings are therefore generally provided with a third electrodeposited layer, which markedly improves corrosion resistance. Connecting-rod bearings and crank bearings constructed in this way find millions of applications in the engine construction industry. However, the three-layer structure of these multilayer materials is technically extremely complex.

It is known from "Gleitlager", E. Schmidt, R. Weber, 1953, p. 192, that with lead-bronzes there is a straightforward correlation between structural formation or structural shape and corrosion behaviour. This means that the more finely crystalline the structure and thus also the more finely the lead particles are dispersed within the matrix, the more corrosion-resistant the material. In addition, it is advantageous for the lead particles to exhibit as fine a globular structure as possible.

To counter effectively the loss in matrix strength as the lead content increases, efforts have been made to achieve as finely crystalline a structure as possible, but lower limits are set to the achievement thereof by for example casting methods. The very much more favourable strength values achieved with finely crystalline metallic materials compared with those which are coarsely crystalline are based on an effect which markedly increases strength and which may be understood from the following background described in "Physikalische Metallkunde", Peter Haasen, 2nd Edition 1984, p. 246:

In metallic materials, deformation is caused by the migration of lattice defects (dislocations). If such a material is present which has as finely crystalline a structure as possible, i.e. a high grain boundary content, then, if deformation and the consequent migration of dislocations occur, the latter become pinned at the grain boundaries and act as obstacles. High internal stress fields are induced thereby, which prevent or at least make more difficult any further migration of the dislocations. This state of affairs results in a direct correlation between grain size and strength in metallic materials by way of the Hall-Petch equation, this so-called grain boundary consolidation increasing as the grain diameter d falls according to $d^{-0.5}$.

These structural requirements in the production of sliding materials may be fulfilled outstandingly by the application of PVD technology (sputtering) to the deposition of this group of materials.

It is known from DE 28 53 724 that the cathodic evaporation of metals, especially AlSnCu alloys, makes it possible to produce overlays which exhibit much higher hardness levels than cast materials of the same chemical composition, and consequently outstanding wear resistance. This higher strength is provided by hard oxide particles finely dispersed in the layer, which result in dispersion strengthening ensuring, particularly at relatively high temperatures, that the mechanical characteristic values, such as high-temperature strength and high-temperature wear resistance, do not drop noticeably, as is known to occur with casting alloys. In the case of this known multilayer material, in which $AlSn_{20}Cu_1$ is preferably sputtered onto a bronze layer, e.g. of $CuPb_{22}Sn$, a diffusion barrier layer is necessary. Diffusion barrier layers of chromium-nickel alloys are proposed therein, because they are also easy to sputter and are distinguished by outstanding adhesion to the backing and a high level of efficacy as a diffusion barrier layer. The provision of an additional diffusion barrier layer is expensive, however. Moreover, although these known multilayer materials are very hard, they exhibit deficits as far as conformability and embedding properties are concerned.

In order to be able to dispense with these nickel-chromium intermediate layers, it was proposed according to EP 0300 993 to construct the sputtered layer in such a way that the matrix material exhibits excellent columnar growth, in the interstitial spaces of which the soft phases are incorporated in fine dispersion. Owing to this columnar growth, which is adjusted by means of the process parameters, it should also be possible to improve abrasion resistance. However, it has proven to be a disadvantage that the columnar crystallites are relatively large, which makes it impossible to achieve a high grain boundary content and thereby results in inadequate strength levels. Furthermore, the embedding properties of the bearing materials is unsatisfactory.

DE 3629451 A1 discloses a composite material which includes in the matrix an insoluble material with a specific particle diameter, the average value of which is $x<0.8$ μm. Normal dispersion with the average value x is clearly obtained by deliberately bestowing special properties on the overlay which consist in the temperature of the substrate remaining below 150° C. during coating. Moreover, an elevated coating speed also contributes thereto. These process features are all conformed to the particle size of the lead particles and not to the crystal structure of the matrix particles, about which no further details are given. The structure of the overlay obtained ensures maintenance of the hardness even after heat treatment lasting 300 hours.

DE 4142454 A1 does not describe any sputtered overlays, but rather recommends the use of plasma arc hardfacing for lead-containing materials. In this process, the temperature loading is greater than is the case with sputtering, and much thicker layers are produced which have then also to be machined. The overlays produced according to this process contain from 5 to 40 wt. % lead, the lead particles having a diameter of up to 50 μm.

DE 3721008 A1 describes a multilayer material in which hard particles are deliberately incorporated, and DE 3813801 A1 relates to a multilayer material with a functional layer applied to a backing layer, which functional layer comprises a thin, uninterruptedly closed surface region in which the dispersion is provided, by melting and rapid cooling from the molten state, with a structure which is improved with respect to the rest of the functional layer and exhibits fine-particled distribution of the undissolved components. The functional layer has in itself a coarse structure, such that structural alterations need be effected by additional measures only in a superficial area.

SUMMARY OF THE INVENTION

The problem on which the invention is based is that of providing a multilayer material whose running layer is distinguished by a high hardness level and simultaneously by good embedding properties and conformability as well as high corrosion resistance.

This problem is solved by a multilayer material whose matrix material is crystallised isotropically with a polygonal grain shape, the average crystallite diameter being 2–4 μm and the grain size of the lead deposits between the crystallites amounting to from 0.2–0.4 times the crystallite diameter.

It has been shown that hardnesses of between 120 and 300 HV may be achieved with such CuPb systems. In the literature relating to plain bearings, layers exhibiting such high hardness levels are generally considered far too hard, since they lack any conformability and embedding capacity, which are considered to be typical plain bearing alloy characteristics. However, it has been shown that the layers according to the invention are very suitable as highly-loadable plain bearings because, as a consequence of the high lead content and the insolubility of lead in the copper sputtering matrix, during the running-in stage of operation of such a plain bearing the surface is very rapidly enriched noticeably with lead. This happens to such an extent that an adherent layer of almost pure lead forms on the surface, which layer ensures very good running-in behaviour. It has also been shown that, as a consequence of the very fine-grained structure and the large grain boundary content connected therewith, lead may be subsequently diffused to the surface at any time from within the copper-lead-tin matrix, i.e. if external influences for example cause the lead-rich layer to be disturbed or worn away, this running layer is relatively quickly regenerated. The mobility of the lead inclusions clearly depends less on the absolute size of the lead inclusions and much more on the matrix structure, whose finely crystalline dispersion and crystallite size have to be conformed to the size of the lead inclusions. Furthermore, the very fine lead dispersion ensures excellent corrosion resistance for bearing alloys with a high lead content.

The lead inclusions advantageously comprise an average grain diameter of between 0.4 μm and 1.6 μm. The upper limit of the average grain diameter thus lies one order of magnitude below the grain diameters which may be produced by casting. Although grain diameters which are too small, i.e. grain diameters of below 0.6 μm, may also be used, it is then difficult to adjust the crystallite diameter of the matrix material to a correspondingly small size so that the relationship according to the invention of crystallite diameter to grain diameter may be maintained. The lead content is preferably from 15–45 wt. %, higher lead contents of from 30–45 wt. % being preferred in order to obtain a sufficiently thick, lead-rich layer on the surface of the bearing material.

The matrix material may contain other additives, either individually or in combination. These include tin, nickel, aluminium and zinc in particular. The proportions of these components are preferably 0–10 wt. % for tin, 2–8 wt. % for nickel, 5–25 wt. % for zinc and 2–10 wt. % for aluminium.

The total thickness of the running layer of the bearing material preferably amounts to from 16–18 μm. For certain applications, the bearing material may be provided with an electrodeposited ternary layer or with a flash. Such a ternary layer may consist of the PbSnCu or SnSbCu systems known per se. It is then preferably applied to the sputtered bearing material, if the multilayer material is provided for applications with particularly critical running-in phases, and serves to cover the period until the lead-rich surface layer is finally formed. The thickness of the ternary layer preferably amounts to from 3–8 μm and the thickness of the flash to from 1–3 μm. The thickness of the sputtered bearing material is reduced in this case to from 10–13 μm, in order not to exceed the desired total thickness of from 16–18 μm.

A steel support may he used as the backing material, and the bearing material may be applied thereto without an additional intermediate layer. There is also the possibility, however, of using a copper-containing backing material, especially a backing material of a copper-lead-tin alloy. The backing material may consist of $CuPb_{22}Sn$, for example.

If the lead content of the backing material is of the order of the lead content of the bearing material, no or only a slight concentration gradient exists between the two materials, such that no diffusion processes may occur between the bearing material and the backing material. If the backing material comprises a higher lead concentration than the bearing material, the migration of the lead to the surface of the bearing material is further promoted. The copper-lead-tin alloy, which forms the backing material, may be cast onto a steel support.

The multilayer material according to the invention is characterised in that the material constituting the backing material, i.e. the cast CuPbSn layer for example, is softer than the sliding material, the sliding material layer being in turn softer than the sliding material over a particular area of its surface owing to the Pb-rich zone which forms. A layered structure, with such hardness graduations, exhibits high wear resistance and corrosion resistance and outstanding embedding properties and conformability.

Exemplary embodiments of the invention are described in more detail below with the aid of the drawings, in which

DETAILED DESCRIPTION OF PREFERRED EMBODIMENTS

Figure 1:
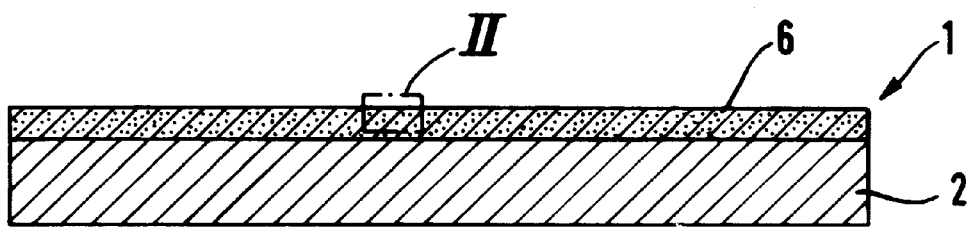
FIG. 1 is a sectional view of a multilayer material.

FIG. 1 is a sectional view of the multilayer material, which consists of a backing material 2 onto which the bearing material is sputtered to form the overlay 6. The latter is a copper-lead alloy, which is shown on an enlarged scale in FIG. 2. The matrix material 4, which consists of copper in the Example shown, is isotropically crystallised with a polygonal grain shape, i.e. there is no preferred direction nor even columnar growth. Lead particles 3 are incorporated at the grain boundaries, their grain sizes lying within the range of 0.2–0.4 μm times the matrix crystals.

The multilayer material shown in FIGS. 1 and 2 was produced as follows.

Bearing liners with a steel/$CuPb_{22}Sn$ structure are applied to a backing in a conventional cathodic evaporation installation aimed at a target exhibiting the composition of the resultant over-lay (e.g. $CuPb_{30}Sn$). After evacuation of the sputtering installation to approximately $10^{-4}$ mbar and flooding of the receptacles with argon, the surface of the bearing liners is open-sputtered by reversing the normal sputtering process.

At a pressure of approximately $3.5 \times 10^{-2}$ mbar and a power density introduced into the target of 13 W/cm$^2$, it was possible subsequently to deposit a layer with the composition $CuPb_{28}Sn$. To achieve the desired sputter layer structure, optimum coating temperatures having proven to be >175° C. The deposition rate achieved with these limit values for the CuPbSn system lies between 0.45 and 0.5 $\mu$m/min (depending on the power introduced into the target).

Overlays produced in this way have a hardness of from 170–190 HV.

Figure 2:
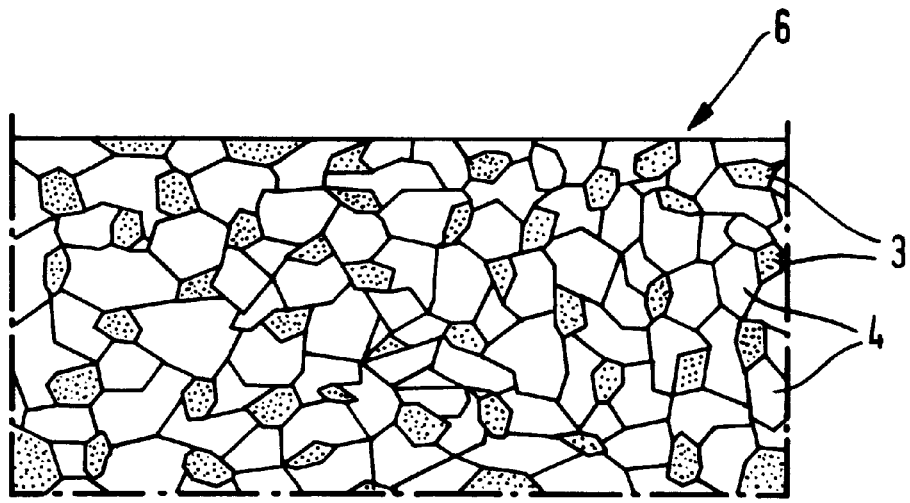
FIG. 2 is an enlarged representation of the sputtered layer shown in FIG. 1.
Figure 3:
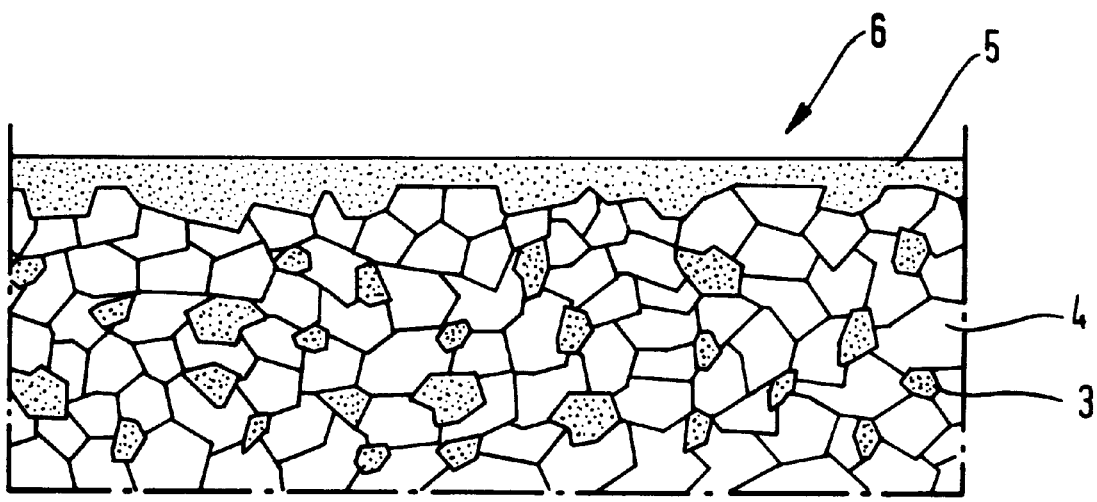
FIG. 3 is an enlarged representation of the sputtered layer after the running-in stage.

FIG. 3 shows a section through the sputtered layer 6 of FIG. 2 after the running-in stage. The running-in stage is the stage lasting until the surface structures of the plain bearing and the counter-member have become conformed to each other. Owing to the development of heat, the lead migrates over the grain boundaries of the matrix material 4 to the surface and there forms a soft covering layer 5, which is from 1–3 $\mu$m thick.

Figure 4A:
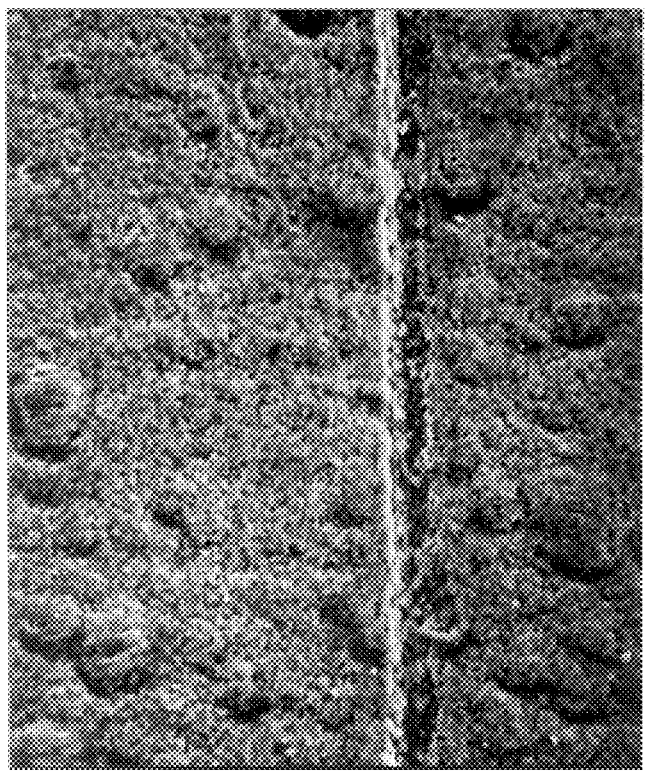
FIGS. 4a–d show scanning electron surface micrographs after a running test, prior to (a) and after (b) removal of the Pb-rich layer, and the associated X-ray spectra (c, d).

FIG. 4a is a surface micrograph of a run-in bearing liner. The good conformation behaviour of the sputter layer is clearly visible and is mirrored in the groove formation caused by dirt particles in the oil.

Figure 4B:
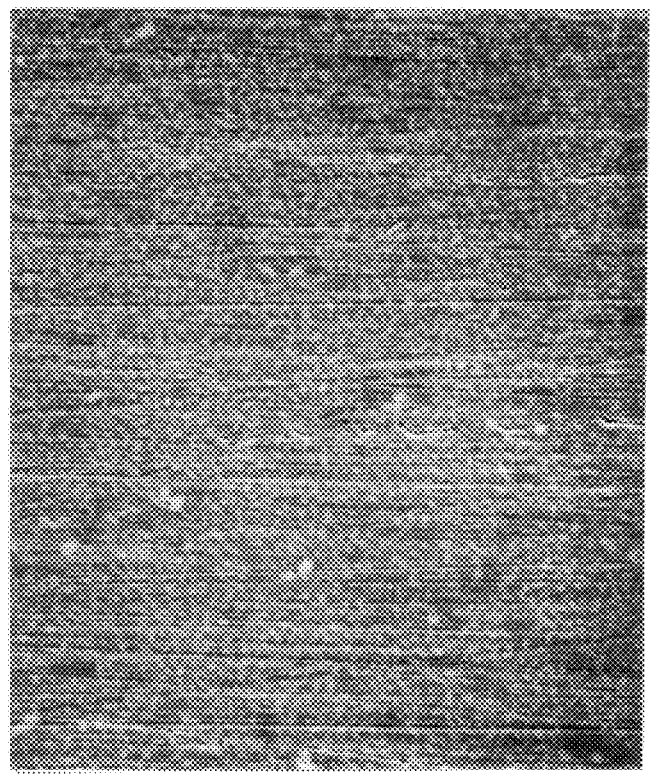
Figure 4C:
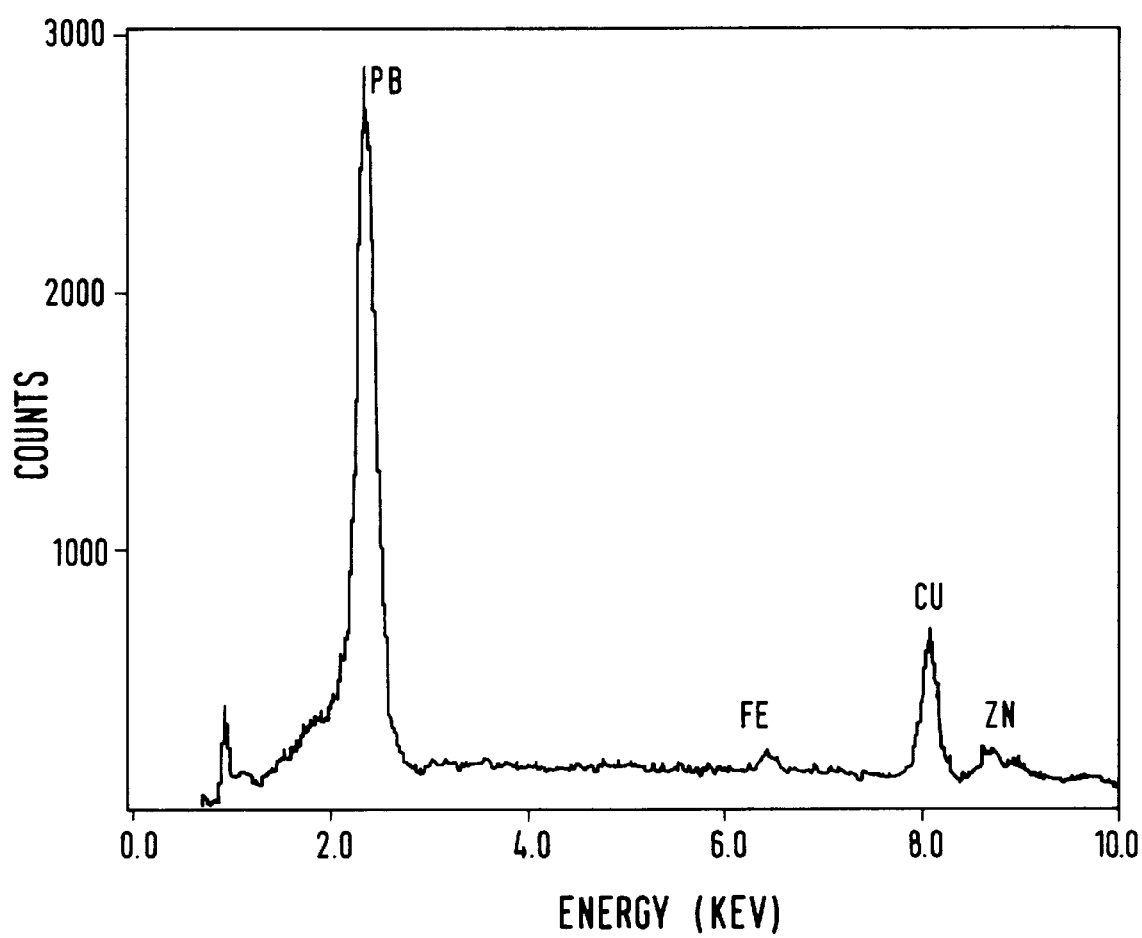
Figure 4D:
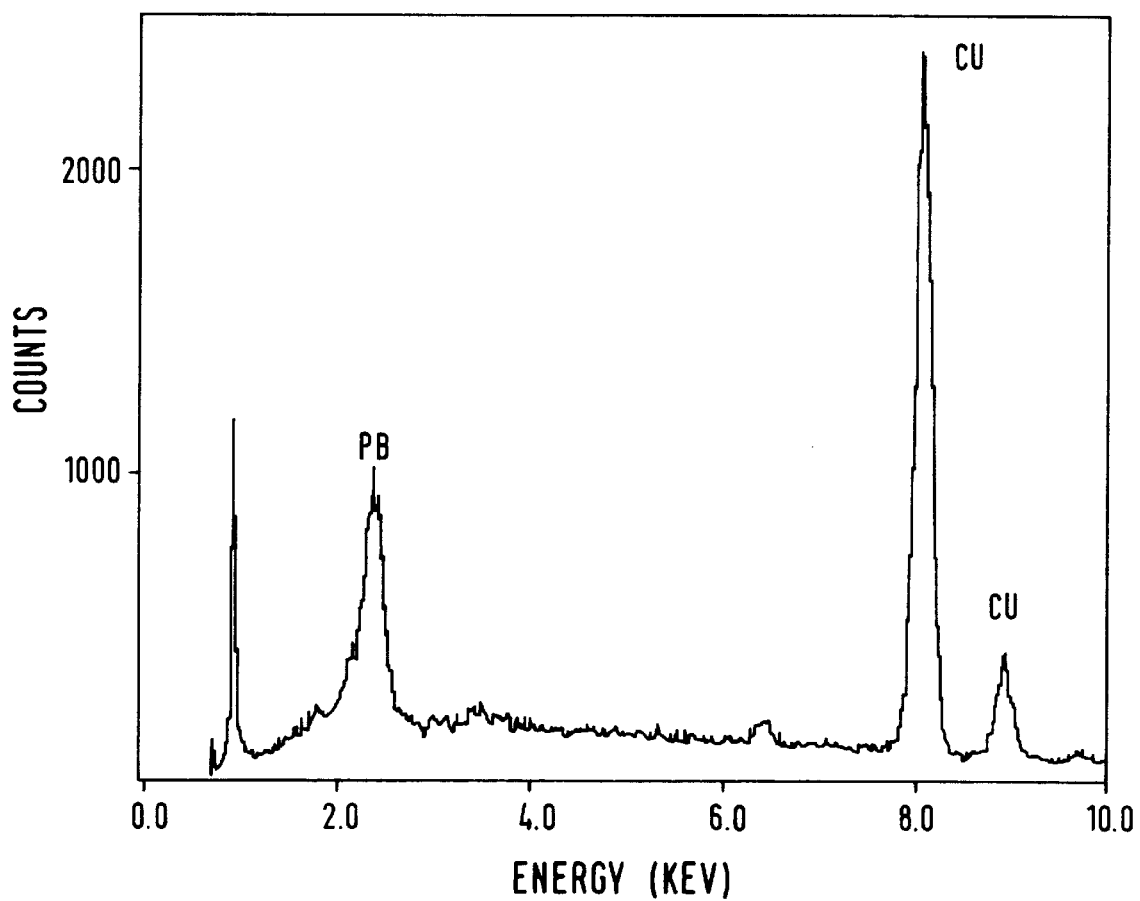

FIG. 4b is another surface micrograph of the same bearing liner, but after removal of the Pb-rich covering layer. The associated X-ray spectra verify the high Pb content of the covering layer (FIG. 4c), which forms during the running-in phase and is responsible for the above-mentioned good conformability of the running layer. The composition of the areas below the Pb-rich layer after removal thereof is shown in FIG. 4d.

Obviously, many modifications and viariations of the present invention are possible in the 'light of the above techings. It is, therefore, to be understood that within the scope of the appended claims, wherein reference numerals are for convenience and not to be considered in any way limiting, the invention may be practiced otherwise than as specifically described.

What is claimed is:

1. A multilayer bearing material comprising a metallic backing layer, and a metallic functional layer applied by sputtering directly to said backing layer, said functional layer including a matrix of copper-based material having inclusions of lead dispersed therein, said copper-based matrix material being isotropically crystallized and having a polygonal grain shape with an average crystallite grain diameter of about 2–4 $\mu$m, said lead inclusions having an average grain diameter that is about 0.2 to 0.4 times that of the crystallite diameter.

2. The multilayer bearing material of claim 1 wherein said copper-based matrix material comprises copper.

3. The multilayer bearing material of claim 1 wherein said copper-based matrix material comprises a copper-based alloy.

4. The multilayer bearing material of claim 1 wherein said average grain diameter of said lead inclusions is in the range of about 0.4 to 1.6 $\mu$m.

5. The multilayer bearing material of claim 1 wherein said lead content of said matrix material is in the range of about 15 to 45 wt. %.

6. The multilayer bearing material of claim 5 wherein said lead content is in the range of 30 to 45 wt. %.

7. The multilayer bearing material of claim 1 wherein said matrix material includes at least one additive consisting essentially of a material selected from the group consisting of: tin, nickel, aluminum, and zinc.

8. The multilayer bearing material of claim 7 wherein said additives, when included in the matrix, are present in the following proportions: tin 0 to 10 wt. %, nickel 2 to 8 wt. %, zinc 5 to 25 wt. %, and aluminum 2 to 10 wt. %, respectively.

9. The multilayer bearing material of claim 1 including an electrodeposited ternary layer applied to said bearing material.

10. The multilayer bearing material of claim 9 wherein said ternary layer has a thickness in the range of about 3 to 8 $\mu$m.

11. The multilayer bearing material of claim 1 including a flash layer applied to said bearing material.

12. The multilayer bearing material of claim 11 wherein said flash layer has a thickness in the range of about 1 to 3 $\mu$m.

13. The multilayer bearing material of claim 1 wherein said bearing material has a thickness in the range of about 10 to 13 $\mu$m.

14. The multilayer bearing material of claim 1 including a layer of material applied to said bearing material consisting essentially of a material selected from the group consisting of an electrodeposited ternary layer and a flash layer and wherein the bearing material and said layer applied to said bearing material have a combined thickness in the range of about 16 to 18 $\mu$m.

15. The multilayer bearing material of claim 1 wherein said backing layer is fabricated of a material containing copper.

16. The multilayer bearing material of claim 1 wherein said backing layer is fabricated of a copper-lead-tin alloy.

17. The multilayer bearing material of claim 16 wherein said backing layer is cast onto a steel support.

18. The multilayer bearing material of claim 1 wherein said backing layer comprises a steel support.

* * * * *

UNITED STATES PATENT AND TRADEMARK OFFICE
CERTIFICATE OF CORRECTION

PATENT NO.  : 6,143,427
DATED       : November 7, 2000
INVENTOR(S) : Gerd Andler It is certified that error appears in the above-identified patent and that said Letters Patent is hereby corrected as shown below: ON THE TITLE PAGE Section [73] Assignee, change "Federal-Mogul World Wide, Inc., Southfield, Mich." to -- Glyco-Metall-Werke Glyco B.V. & Co. KG, Wiesbaden, Germany --.

Signed and Sealed this

Eighth Day of May, 2001

Attest:

NICHOLAS P. GODICI

Attesting Officer

Acting Director of the United States Patent and Trademark Office